US006865701B1

(12) United States Patent
Youngs et al.

(10) Patent No.: US 6,865,701 B1
(45) Date of Patent: Mar. 8, 2005

(54) METHOD AND APPARATUS FOR IMPROVED MEMORY CORE TESTING

(75) Inventors: Lynn R. Youngs, Cupertino, CA (US); Derek F. Iwamoto, San Jose, CA (US)

(73) Assignee: Apple Computer, Inc., Cupertino, CA (US)

( * ) Notice: Subject to any disclaimer, the term of this patent is extended or adjusted under 35 U.S.C. 154(b) by 487 days.

(21) Appl. No.: 09/823,148

(22) Filed: Mar. 29, 2001

(51) Int. Cl.[7] ............................................. G11C 29/00
(52) U.S. Cl. ...................... 714/718; 714/30; 365/201
(58) Field of Search ................................ 714/718, 727, 714/30; 365/201

(56) References Cited

U.S. PATENT DOCUMENTS

| | | | |
|---|---|---|---|
| 4,495,628 A | | 1/1985 | Zasio |
| 4,495,629 A | | 1/1985 | Zasio et al. |
| 4,912,709 A | | 3/1990 | Teske et al. |
| 4,969,148 A | * | 11/1990 | Nadeau-Dostie et al. ... 714/718 |
| 5,003,204 A | | 3/1991 | Cushing et al. |
| 5,130,568 A | | 7/1992 | Miller et al. |
| 5,254,942 A | * | 10/1993 | D'Souza et al. ............ 714/727 |
| 5,257,223 A | | 10/1993 | Dervisoglu |
| 5,355,369 A | * | 10/1994 | Greenberger et al. ....... 714/727 |
| 5,689,517 A | | 11/1997 | Ruparel |
| 6,070,252 A | * | 5/2000 | Xu et al. ...................... 714/30 |
| 6,070,256 A | * | 5/2000 | Wu et al. .................... 714/718 |
| 6,122,762 A | * | 9/2000 | Kim ............................ 714/726 |
| 6,404,684 B2 | * | 6/2002 | Arimoto et al. ............ 365/201 |
| 6,563,751 B1 | * | 5/2003 | Wu ............................. 365/201 |

OTHER PUBLICATIONS

"Designing Dual Personality IEEE 1149.1 Compliant Multi–Chip Modules", Najmi Jarwala, 1994, IEE International Test Conference 1994, paper 19.3, pp 446–455.*

"Considerations for implementing IEEE 1149.1 on system–on–a–chip integrated circuits", Steven F. Oakland, Test Conference, 2000. Proceedings International, Oct. 3–5, 2000, pp 628–637.*

"Testability, Debuggability, and Manufacturability Features of the UltrSPARC–I Microprocessor", Levitt et al., 1995, International Test Conference 1995, paper 6.2, pp 157–166.*

"A 5 GB/s 9–Port Application Specific SRAM with Built–in Self Test", Wood et al., 1995 International Workshop on Memory Technology, Design and Testing, 1995, Aug. 7–8, 1995, pp 68–73.*

"IEE Standard Test Access Port and Boundary Scan Architecture", 1990, IEEE Standard 1149.1.*

S. Yurash et al., "Automatic Test Pattern Generation Comes of Age," Electronic Engineering, vol. 63, No. 777, Sep. 1991, London GB, pp. 35–36 & 38.

E.B. Eichelberger et al., "A Logic Design Structure for LSI Testability," Reprinted from The Proceedings of the 14th Design Automation Conference by the Institute of Electrical and Electronics Engineers, Inc., pp. 206–212 (1997).

Youngs, L. et al., Design of the UltraSPARC™—I Microprocessor for Manufacturing Performance, pp. 179–186, SPIE vol. 2874, Texas Instruments, Inc., Stafford, Texas, USA.

* cited by examiner

Primary Examiner—Guy J. Lamarre
Assistant Examiner—John P Trimmings
(74) Attorney, Agent, or Firm—Blakely, Sokoloff, Taylor & Zafman LLP

(57) ABSTRACT

A memory unit is described that has a controller coupled to a memory core through an interface circuit. The interface circuit has a test data input that receives test data from the controller. The interface circuit also has a system data input that receives data from a system. The interface circuit has a data output that is coupled to a data input of the memory core.

18 Claims, 9 Drawing Sheets

US 6,865,701 B1

METHOD AND APPARATUS FOR IMPROVED MEMORY CORE TESTING

FIELD OF THE INVENTION

The field of invention relates generally to memory devices; and more specifically, to a method and apparatus for improved memory testing.

BACKGROUND a. Conventional Memory Core

FIG. 1a shows a memory core 101a. Typically, a memory core 101a is constructed with Dynamic Random Access Memory (DRAM) or Static Random Access Memory (SRAM) cells that store binary information (i.e., a "1" or "0"). For RAM cells, binary information is written to the cells via the Data_In input 102 and Information is read from the cells via the Data_Out output 104.

Other forms of cells that may be used to construct memory core 101a include Content Addressable Memory (CAM) cells and Read Only Memory (ROM) cells. CAM cells are designed to look for a "match" between stored information and offered information. As such, offered information is presented at the Data_in input 102 and the address location of matching data is presented at the Data_Out output 104. ROM cells are typically programmable. As such, the information to be programmed is entered at the Data_In input 102 and read from the Data_Out output 104.

Regardless of the type of memory cell used to construct memory core 101a, both the Data_in input 102 and the Data_Out output 104 typically take the form of a bus that holds a plurality of bits. As such, multiple cells may be simultaneously written to or read from. The address bus 103 is used to identify the particular group of cells that are simultaneously written to or read from. A read enable (RE) 190 is active during a memory read and a write enable (WE) 191 is active during a memory write.

b. Multi-Port Memory Core

A multi-port memory core includes a plurality of memory ports such as the three Data_In ports 102a, 102b, 102c and the three Data-Out ports 104a, 104b, 104c seen in the exemplary, three port, multi-port memory core 101b of FIG. 1b. The exemplary multi-port memory core 101b of FIG. 1b also has three address ports 103a, 103b, 103c. Each input/output port pair is used with its corresponding address port. That is, for example, input port Data_InA 102a is provided write data that is written to the address specified by address port 103a. Similarly, output port Data_OutA is provided read data that is read from the address specified by address port 103a. Each port also has its own corresponding write enable input (e.g. We_A 190 for input port A, We_B 191 for input port B and We_C 192 for input port C). A write enable input is active if its corresponding input port is to be written to. A separate read enable input (not shown in FIG. 1b for simplicity) may also be activated to read data from a particular output port.

A problem with memory cores, whether conventional as seen in FIG. 1a, multi-port as seen in FIG. 1b, or otherwise, is the testing of such devices. Typically memory cores have dedicated, hardwired built in self test (BIST) circuitry that can apply only a limited overall range of combinations of data patterns and/or data addresses that the memory could be asked to perform in the field.

Furthermore, as a system (e.g., a computing or networking system) frequently depends upon the operation of a plurality of memories, the testing problem described above becomes more severe if testing of a plurality of memories is attempted. That is, the system (or at least the memory portion of system) can only be tested to a limited overall range of data patterns and/or addresses that the collection of memories could be asked to perform in the field.

BRIEF DESCRIPTION OF THE DRAWINGS

The present invention is illustrated by way of example, and not limitation, in the Figures of the accompanying drawings in which:

FIGS. 7a through 7d relate to clocking issues associated with the clocking the plurality of memory units seen in FIG. 4.

DETAILED DESCRIPTION

Figure 2A:
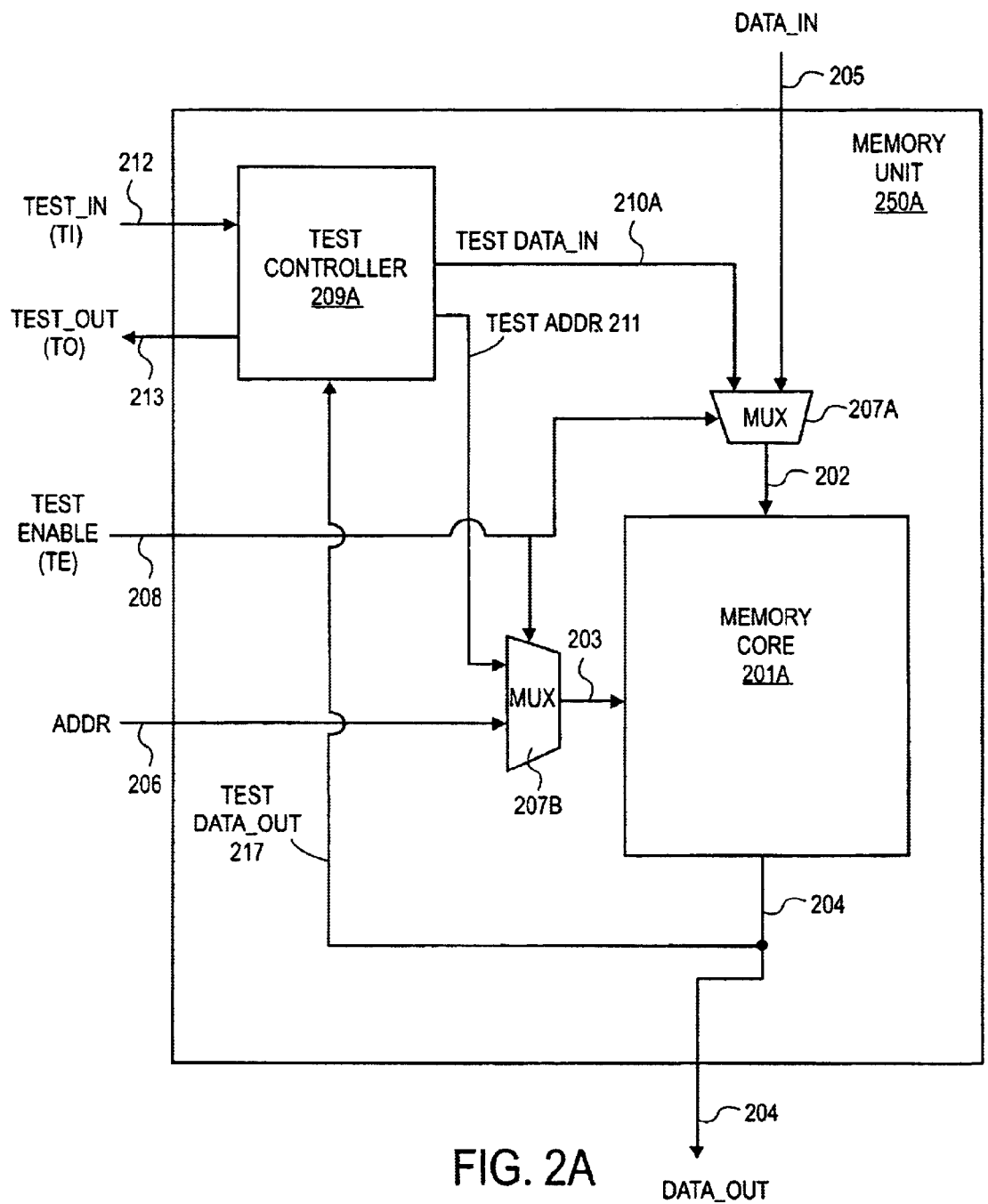
FIG. 2a shows a memory unit having a controller coupled to a memory core.

A solution to the problem described in the background includes a memory unit having a controller that is coupled to a memory core. FIG. 2a shows such an approach. A memory unit 250a is a memory core 201a supported by testing circuitry that is local to the memory core. By incorporating a memory unit into a design, a design simultaneously provides a mechanism for storing data (i.e., the memory core 201) and a mechanism for testing the memory core 201 (e.g., the test controller 209a and its associated logic).

Figure 1A:
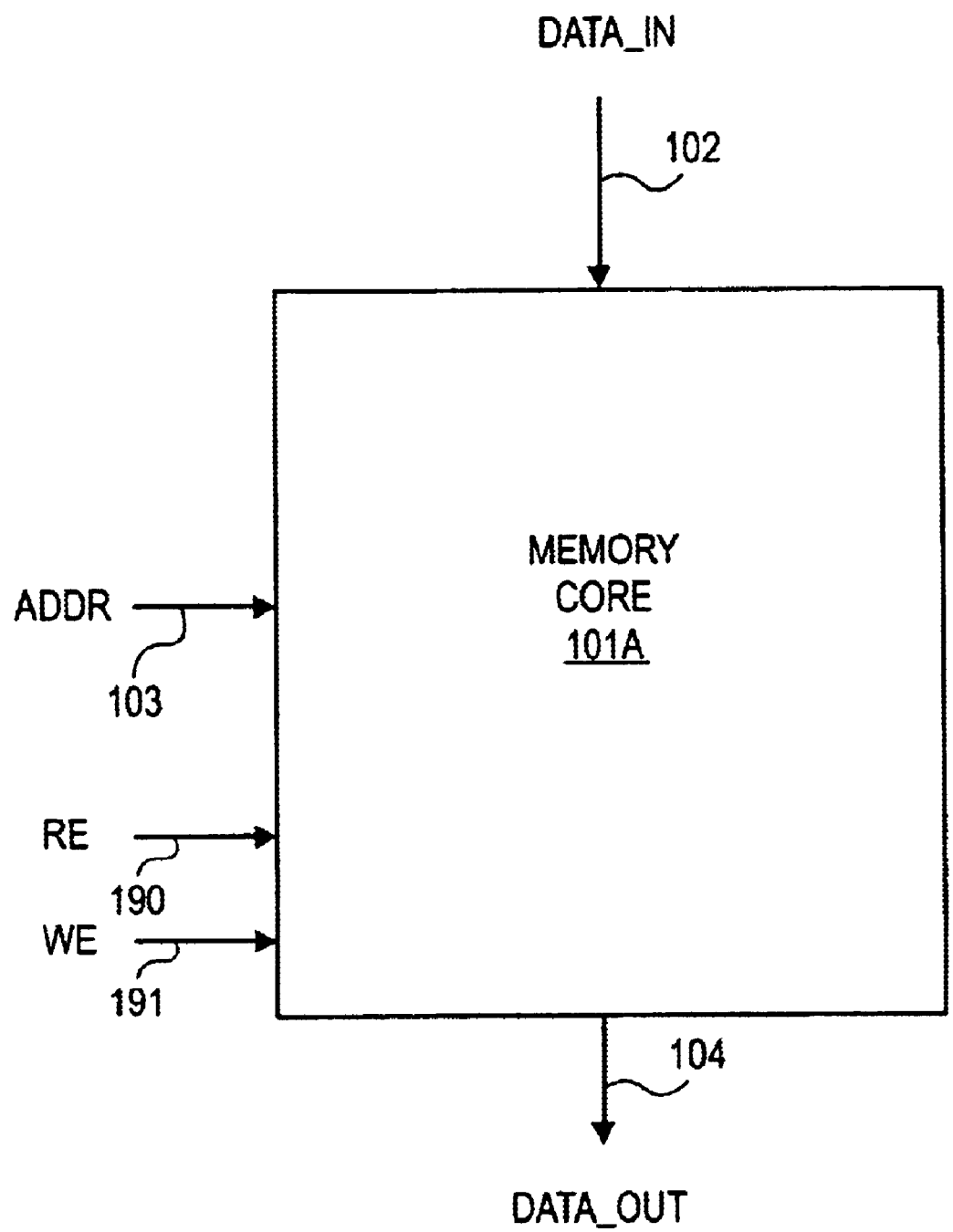
FIG. 1a shows a conventional memory core.
Figure 1B:
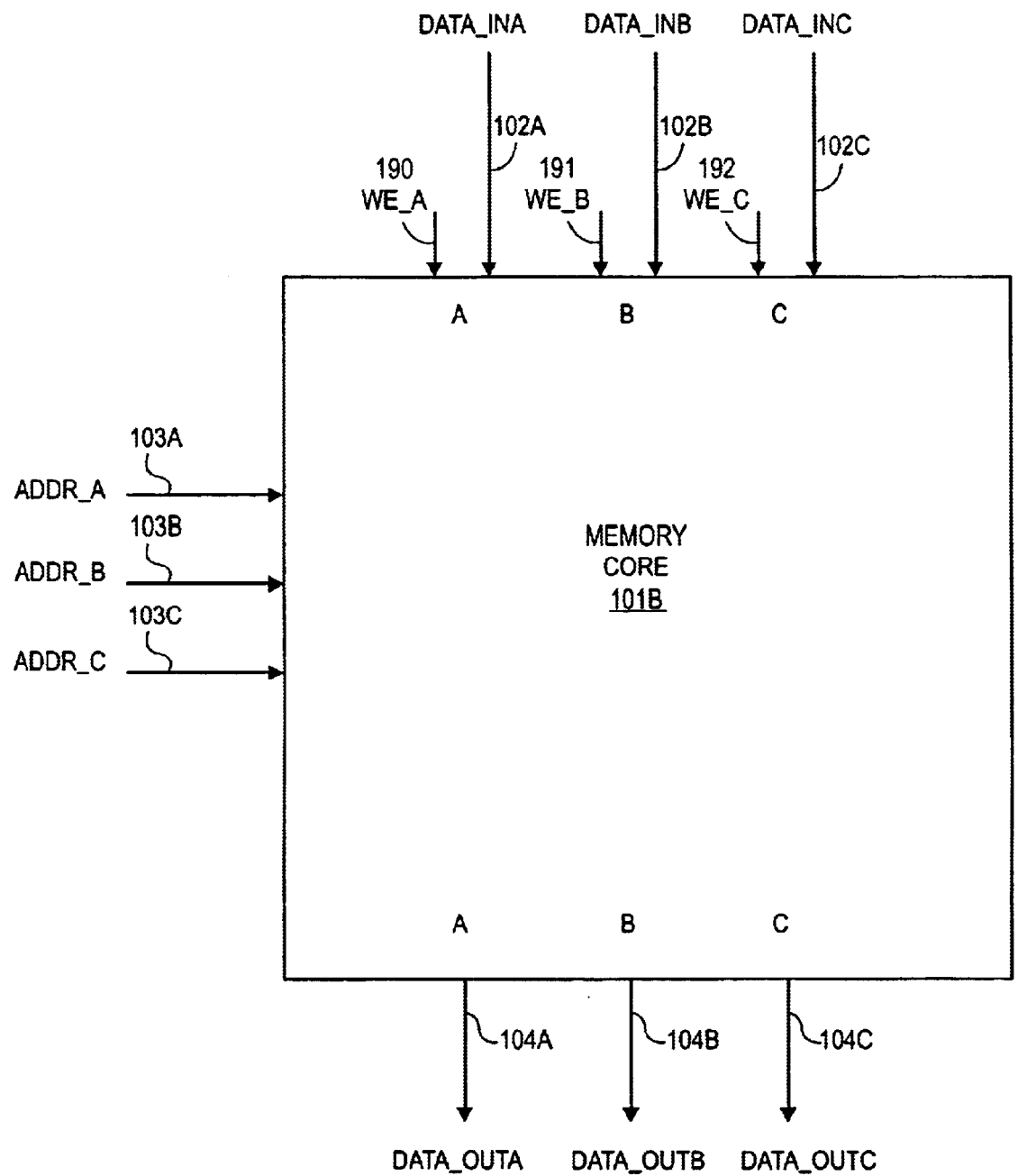
FIG. 1b shows a multi-port memory core.
Figure 2B:
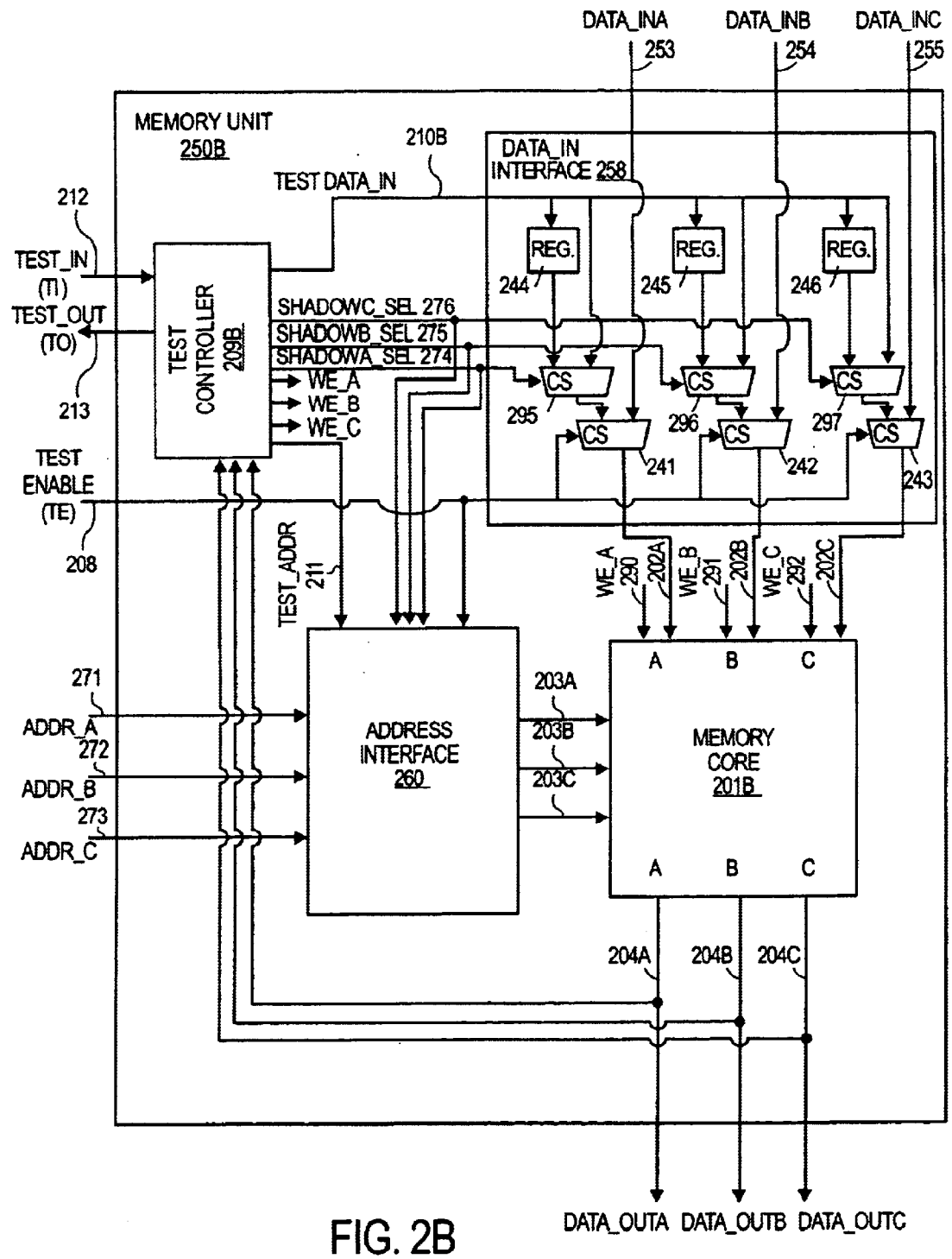
FIG. 2b shows a memory unit having a controller coupled to a multi-port memory core.

The memory core 201a of FIG. 2a corresponds to the conventional memory core 101a of FIG. 1a. However, as explained in more detail below, the approach of FIG. 2a is extendable to other memory core designs such as the multi-port memory core 101b shown in FIG. 1b. An example of such an approach is seen in FIG. 2b and discussed in more detail further below. Note that the memory unit 250a of FIG. 2a shows a controller 209a coupled to a memory core 201a.

The controller 209a corresponds to the mechanism used to test the memory core 201a. The controller 209a deciphers commands received at a Test-In (TI) input 212 and converts them into actions that are performed upon the memory core 201a in order to test the memory core 201a. As such, the controller 209a has logic that interprets a command received at the TI input 212 and logic that, in response, performs or triggers the performance of specific actions upon the memory core 201a.

A review of some possible commands is provided in more detail below. However, before beginning a discussion of these commands, an overview of the operation of the memory unit 250a will be provided. The memory unit 250a embodiment of FIG. 2a operates in two modes: a normal operational mode and a test mode. During normal operational mode, the memory unit 250a behaves as if the testing mechanisms are not present.

That is, the memory unit 250a behaves according to the operation of the memory core 201a. Note the presence of multiplexers 207a,b and multiplexer respectively coupled to the memory core data input 202, the memory core address input 203 and the memory core data output 204. During normal operational mode, the Test_Enable (TE) is inactive which configures: 1) multiplexer 207a to select the Data_In input 205 (which may be referred to as a system data input); and 2) multiplexer 207b to select the address input 206 (which may be referred to as a system address input).

Similarly another pair of multiplexers (not shown in FIG. 2a for simplicity) may be similarly configured to select a system read input and a system write input (again, not shown in FIG. 2a for simplicity). As such, during normal operational mode the memory unit 250a operates as a conventional memory core (such as the conventional memory core 101a of FIG. 1a) where the Data_In input 205, Address input 206 and Data_Out output 204 of the memory unit 250a respectively correspond to the Data_In input 102, Address input 103 and Data_Out output 104 of FIG. 1a.

During test mode, however, the Test Enable input 208 is active which configures multiplexer 207a to select the Test Data_In output 210a from the controller 209a and multiplexer 207b to select the Test Address output 211 from the controller 209a. Similarly, other multiplexers (not shown in FIG. 2a for simplicity) are configured to select separate read and write signals from the controller (again, not shown in FIG. 2a for simplicity). As such, during test mode, the memory core's data input 202, address input 203, read input and write input are driven by the controller 209 rather than the system inputs from outside the memory unit 250a.

Furthermore, as seen in FIG. 2a, the memory core data output 204 is coupled to an input of the controller 209a. Thus, during test mode, the controller 209a controls the memory core 201a inputs and has access to the memory core 201a outputs. From this position, the controller 209a can apply input test signals and monitor and/or collect test output signals.

During test mode the controller 209a receives test commands from the Test_In (TI) input 212. In response to a command received at the Test In input 212, the controller performs certain test actions upon the memory core 201a and/or presents test related results on the Test_Out (TO) output 213. A discussion of some of the test commands follows below. However, before commencing such a discussion, note that the memory test unit 250a of FIG. 2a may be extended to apply to a multi-port memory core such as the multi-port memory core 101b of FIG. 1b.

A depiction of such an extension is shown in FIG. 2b. The multi-port memory core based memory unit 250b of FIG. 2b has a normal operational mode and a test mode. During normal operational mode, for a write operation, data is presented on those of the Data_In inputs 253, 254, 255 that correspond to a port that is to be written to. A corresponding address is also offered at the appropriate address input. For example, if data to be written is presented to the Data_InC input 255, an address is presented to the ADDR_C input 273.

Note that a Data_In interface 258 is located between the Data_In inputs 253, 254, 255 and the multi-port memory core 201b. The Data_In interface 258, in this embodiment, has logic that provides system data (from inputs 253, 254, 255) or test data (from the test controller 209b via the Test Data_in 210b signal line) to the multi-port memory core 201b, depending on which mode the memory unit 250b: is in.

Within the Data_In interface 258, during normal operational mode, the test enable (TE) input 208 is inactive. This forces multiplexer 241 to select the Data_InA input 253, multiplexer 242 to select the Data_InB input 254 and multiplexer 243 to select the Data_InC input 255. A similar arrangement of multiplexers (not shown in FIG. 2b for simplicity), having their channel selection controlled by the Test Enable (TE) input 208, may be used to establish the write enable lines (WE_A 290, WE_B 291, WE_C 292) and read enable lines (also not shown in FIG. 2b for simplicity) for each port. As such, during normal operational mode, the data inputs, write enable signals and read enable signals that are offered from the system are presented to the multi-port memory core 201b.

The address interface 260 may be implemented with a design that is analogous to the design observed for the Data_In interface 258. As such, during normal operational mode, a system address presented at any of the system address inputs 271, 272, 273 will be directed to the multi-port memory core 201b (e.g., by configuring multiplexers that are analogous to multiplexers 241, 242 and 243 to select address inputs 271, 272, 273 when the test enable TE is inactive).

During test mode, the operation of the interface units 258, 260 can occur in two stages. During a first stage that may also be referred to as the "preload stage": 1) (for preload write operations) data to be written is presented (from the test controller 209b) at the Test Data_In input 210b and the corresponding address for the data is presented (from the test controller 209b) at the Test_Addr input 211; 2) (for preload read operations) the address for the data to be read is presented to the address interface 260.

During a preload write stage the test data and address offered by the test controller 209b are latched by registers within each interface 258, 260. That is, the test data is latched by registers 244, 245 and 246 within the Data_In interface 258 and the address is latched by analogous registers within the address interface 260. During a preload read stage, the appropriate address is latched into the same analogous registers within the address interface 260.

During a second stage, which is either a write operation or a read operation: 1) (for a write operation) the write enable inputs are activated by the test controller 209b for those ports that are to be written to (e.g., WE_A 290 for port A, WE_B 291 for port B, and WE_C 292 for port C) and data is written into the port from either the register or the test controller 209b (depending on the value of the Shadow_Sel signal for each activated port); 2) (for a read operation) data is read from the multi-port memory core 201b from those ports whose read enable lines are activated by the test controller 209b.

For either read or write operations the appropriate address for the operation, depending upon the value of the Shadow_Sel signal for the enabled port, is released from a register within the address interface 260 or is sent from the test controller 209b. The Shadow Sel signals (e.g., ShadowA_Sel 274 for port A, ShadowB_Sel 275 for port B, ShadowC_Sel 276 for port C), multiplexers 295, 296, 297 and registers 244, 245, 246 allow test data directed to a particular "target port" to be directed to a port other than the target port in the following write operation.

A target port corresponds to the port being written into by the test controller directly on a given write operation. For example, if port C is the target port for a particular write operation, the ShadowC_Sel 276 signal is positioned to force multiplexer 297 to select the Test Data_In 210b from the test controller 209b (rather than register 246). As such, the data on the Test Data_In 210b line is written into port C.

During this write operation, a preload write operation is performed in which the data being written into port C is also written into registers 244, 245 and 246. As such, during the next write operation, any port can be written into with the same data just written into port C if the value of the Shadow_Sel line is positioned to force the selection of the register output.

Note the wide versatility offered by this architecture. To first order, any data pattern may be presented on the Test Data_In line 210b. Furthermore, the data pattern presented on the Test Data_in line 210b may be offered to any input port of the memory core 201b during the current write operation (if the corresponding Shadow_Sel value enables the Test Data_In line 210b) or the following write operation (if the corresponding Shadow_Sel value enables the register output). Further still all, some or none of the memory core ports may be written to depending on the test controllers manipulation of the write enable inputs WE_A 290, WE_B 291, WE_C 292.

Similar versatility exists for read operations. That is, any address may be presented on the Test_Addr line 211. Furthermore, the address presented on the Test_Addr line 211 may be offered to any address port of the memory core 201b during the current read operation (if the corresponding Shadow_Sel value enables the Test_Addr line 211) or the following read operation (if the corresponding Shadow_Sel value enables the analgous register output). Further still all, some or none of the memory core ports may be read from depending on the test controller's manipulation of the read enable inputs (not shown in FIG. 2b for simplicity).

Figure 3:
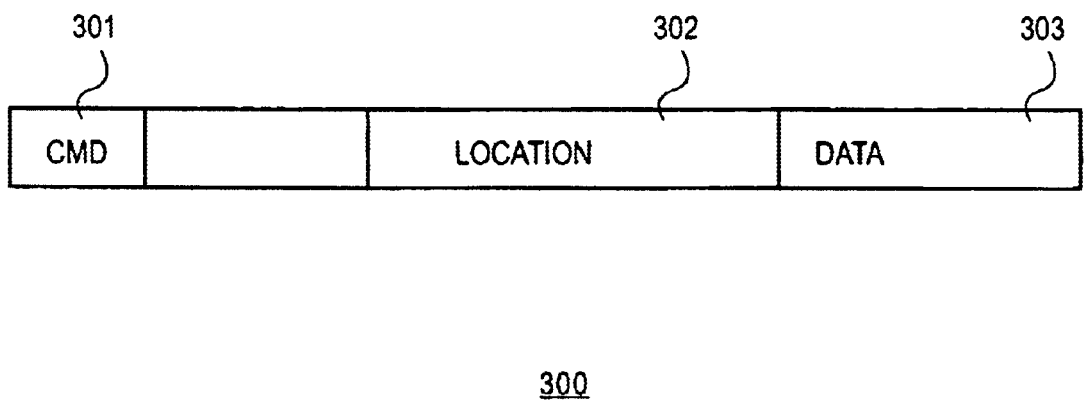
FIG. 3 shows a test command format that may be used to communicate memory core test commands to the controller of FIG. 2.

Following immediately below is a discussion of some commands that the controller 209a, b of FIGS. 2a and 2b may be designed to perform during test mode. FIG. 3 shows an exemplary command format 300 that may be used to communicate memory core test commands to the controller. As a result, the command format 300 of FIG. 3 may be referred to as a test command. Referring to FIGS. 2a and 2b, the test command 300 is received at the Test_in input 212; of the controller. The test command embodiment of FIG. 3 includes a command field 301, a location field 302 and a data field 303.

The command field 301 specifies the particular act or actions to be performed by the controller (e.g., PRELOAD, READ, WRITE, etc.) upon the memory core. More discussion of some test command examples are provided in more detail below. For a multi-port memory core, the location field 302 may be used to specify the particular target port the action is to be directed to (e.g., a "PORTID" parameter that indicates the target port for the applicable command). For a multi-port or conventional memory core, the location field 302 may also be used to define the particular byte(s) that are to be written to or read from the memory core.

That is, recall that a memory core's data input or data output are usually in the form of a bus that comprises a plurality of bits. The full width of the bus (i.e., all of the bits) may be referred to as word. In some cases it may be desirable to test the memory core with a complete word or with less than a complete word. For test cases involving less than a complete word, the individual bytes of a word that apply may be particularly specified within the location field 302.

The location field 302 may also be configured to hold the address that is particular to the test command. For example, for a WRITE command, the location field 302 may carry the memory core address where data is to be written to. As another example, for a READ command, the location field 302 may carry the memory core address where data is to be read from the memory core.

In an embodiment, therefore, the location field 302 is partitioned into: 1) a first reserved section that specifies which port of a multi-port memory is the target port for the command (e.g., the PORTID referred to above); 2) a second reserved section that indicates whether the command applies to a full word or less than a full word; 3) a third reserved section that specifies which bytes of a word apply if the command applies to less than a full word; and 4) a fourth reserved section that holds the address that is particular to the command. A controller coupled to a conventional core may ignore entries found within the first reserved section described above.

The data field 303 provides data to be written into the memory core in those port(s) and/or byte(s) specified by a WRITE command. The data field 303 also provides data that was read from the memory from those port(s) and/or bytes(s) specified by a READ command. Note, therefore, that the command format 300 of FIG. 3 may also correspond to an output presented at the Test_Out output 213 of the controller 209b. That is, for READ commands, the controller presents information (e.g., in the form of command format 300 of FIG. 3) as part of the actions performed in response to the test command. The command field 301 may be used to specify that the appended information corresponds to controller output data.

A single port memory core and its corresponding controller (such as memory core 201a and controller 209a of FIG. 2a) may write bytes or full words in response to command received at the Test_In (TI) input 212 by applying the appropriate data and address on the Test Data_In 210a and Test_Addr 211 lines, respectively. Data may be read from the memory core 201a by applying the address on the Test_Addr 211 line and presenting the read data at the Test_Out (TO) output 213.

The following is a discussion of some possible commands that may be performed by the multi-port memory controller 209b of FIG. 2b. Each test command may be given a unique binary value that is placed in the command field 301 of the command format 300 of FIG. 3. Five test commands are reviewed below: a PRELOAD WRITE command, a PRELOAD READ command, a WRITE BYTE command, a WRITE WORD command, and a READ command.

PRELOAD WRITE

Referring to FIG. 2b, after the controller receives a PRELOAD WRITE command, the controller enters data (found in the test command data field 303) upon the Test Data_In line 210b. As a result, the data is latched into registers 244, 245, 246. The address (also specified within the location field 302 of the test command) is also entered at the Test_Addr signal line 211. As a result, the address is latched into the analagous registers of the address interface 260. Data is not written into memory core 201b. As such, the write enable lines 290, 291, 292 are held inactive by the controller 209b.

PRELOAD READ

After the controller receives a PRELOAD READ command, the controller enters the address (found in the test command data field 303) upon the Test_Addr signal line 211. As a result, the address is latched into registers that are coupled to each memory port within the address interface 260. Data is not read from the memory core 201b. As such, the read enable lines of the memory core 201b are held inactive by the controller 209b.

WRITE BYTE

After the controller receives a WRITE BYTE command, the controller 209b writes a byte of data into the memory core 201b. In an embodiment, a target port (e.g., the PORTID referred to above) as found in a first partition of the location field 302 (referring briefly to FIG. 3) is the port into which data is written. As such, the data (as found in the data field 303) is entered upon the Test Data_In line 210b. The controller 209b furthermore affects the Shadow_Sel line associated with the target port (e.g., Shadow C_Sel 276 for a target port that corresponds to port C) such that the Test_Data_In line 210b is selected. As such, the data in the data field 303 is written into the target port specified by the PORTID.

Furthermore, those "remainder" ports that are not pointed to by the PORTID (e.g., ports A and B if the PORTID points to port C as the target port) may be simultaneously written to with the contents of their respective registers (e.g., register 244 for port A and register 245 for port B). Whether or not a remainder port is to be written to is specified, in an embodiment, by a fifth partition of the location field 302. That is, the location field 302 may be further partitioned into a fifth reserved section (referred to as the SMASK) that specifies which remainder ports are written to be with register contents and which remainder ports are not to be written to at all during this write cycle operation.

Remainder ports to be written to with register contents have their Shadow_Sel line values appropriately positioned (to enable the register output) and have their WE write enable lines activated by the controller 209b. Those remainder ports not to be written to have their WE write enable lines deactivated by the controller 209b.

For a WRITE BYTE command, in an embodiment, the controller 209b also looks to the second and third reserved sections of the location field 302 (referred to above) to recognize: 1) that only a byte is to be written into the target port and 2) which byte location of a full word the WRITE BYTE command applies to. The controller 209b also sends the address found in the fourth reserved section of the location field 302 along the Test_Addr line 211. As such, due to the manipulation of the Shadow_Sel and WE write enable lines discussed just above, the address found in the location field 302 controls where the data entered at the target port is stored. Furthermore, the contents of the analagous registers within the address interface 260 control where register data entered into the written to remainder ports are stored.

WRITE WORD

A WRITE WORD command may be orchestrated to operate the same as a WRITE BYTE command. However, by looking to the second reserved location of the location field 302, the controller 209b understands that a full word is to be written to the target port specified by the comand.

READ

After the controller receives a READ command, data is read from the target port that is specified by the 209b PORTID section of the location field 302. That is, the address found in the (fourth reserved section) of the location field 302 is entered on the Test-Addr line 211 and applied to the target port address via manipulation of the Shadow_Sel line associated with the target port. The read enable line of the target port is also activated by the controller 209b. Remainder ports pointed to by the SMASK (e.g., fifth reserved) section of the location field 302 may also be read from via appropriate manipulation of the Shadow_Sel and read enable lines. Again, an address stored in a register within the address interface 260 is used to read from a pointed to remainder port.

Regardless of the type of the core employed, the data received from the memory core is presented at the controller output (e.g., at the Test_Out output 213 seen in FIG. 2b). In an embodiment, the data is presented at the controller output in a format similar to the command format seen in FIG. 3. The command field 301 specifies the data located in the data field 303 is an output of the controller that has resulted from a memory core read.

Before continuing, note the testing versatility offered by the command set discussed above. Any port may be written to or read from simultaneously with other ports or alone. Furthermore any test data pattern may be applied to the memory core. The following includes a discussion of how a memory unit (such as the memory units 250a, 250b of FIG. 2a, 2b) may be applied to the testing a system having multiple memory cores. It is important to point out that memory unit architectures other than the particular memory units 250a, 250b discussed above (e.g., having the command set and interface 258, 260 design shown in FIG. 2b) may apply the teachings that follow. As such, the following discussion should not be construed as limited to the particular memory units 250a, 250b discussed above.

Furthermore, it is important to note that the testing versatility alluded to above allows for robust system level testing of a system that employs one or more memory cores. For example, referring to FIG. 4, note the plurality of memory units 450a, 450b through 450N. Each memory unit may be configured as discussed wherein a memory core and test controller is included within each memory unit.

Figure 4:
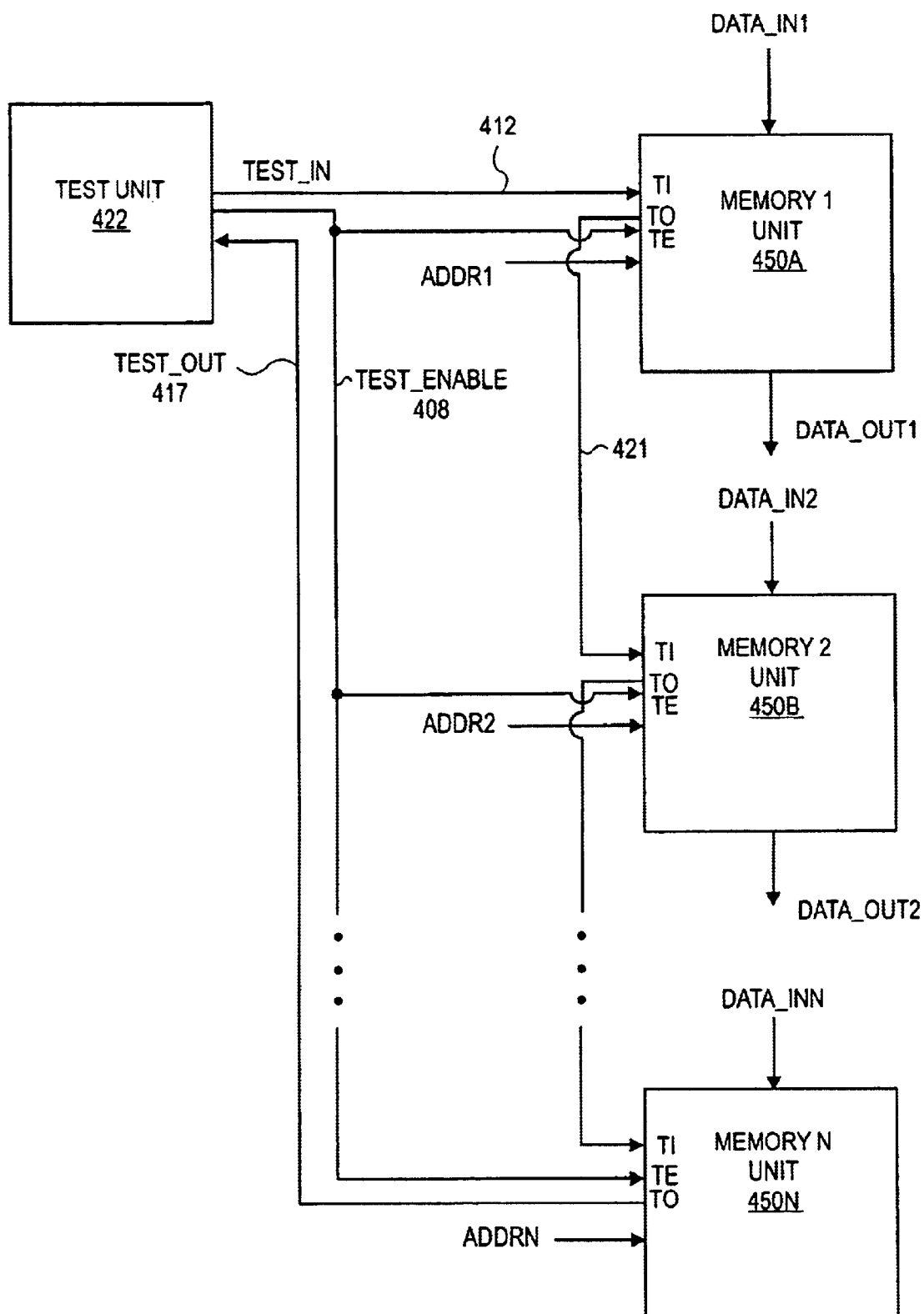
FIG. 4 shows a plurality of memory units coupled in a daisy chain for testing.

Thus, a plurality of memory cores may be associated with the depiction observed in FIG. 4. In various embodiments, the plurality of memory cores may be part of a larger "system" that depends upon the memory cores. For example, within many "systems" a processor is communicatively coupled to a plurality of memory cores in order to execute the software that is run by the system. Examples of such systems may be commonly found in computer CPUs, adapter cards, system-on-chip semiconductor chips, etc.

The testing versatility of each memory core (as offered by each memory unit 450a, 450b through 450N) allows for robust system level testing. That is, for example, "debug" testing during product development or "functional quality and assurance" testing during product manufacturing may take advantage of the ability to write various combinations of data patterns in order to effectively "jump start" the system to a particular state (e.g., a particular location of a particular software program).

Thus, if a particular software program (and/or a particular portion of a software program) is desired to be executed during test, the memory cores may be loaded with the proper data patterns that imitate those values that the software program installs, needs and/or expects in order to execute. As another example, if the system "hangs" (i.e., a software program freezes), the memory cores may be "dumped" (i.e., their contents fully read and collected) so that engineers can view at which software location the problem occurred.

As another related example, regardless if a full memory dump is performed, read data from the memory core may be compared against whatever values are expected (or are supposed to be) stored within the memory core. As such, system failures can be traced to a particular "bad" portion of data within the memory. Entire memory cores, entire portions of one or more memory cores, or the contents of an individual memory cell may be compared against expected data in order to trace a system failure. Thus a wide range of testing granularity exists in order to isolate the cause of a system failure.

Note that other systems exist that depend upon one or memory cores (besides a processor communicatively coupled to one or more memory cores to run software). For example, logical structures such as pipelines or queues (e.g., a first-in-first-out (FIFO) queue) also depend upon the operation of memory. The above system level testing approaches and consequential versatility apply to these systems as well.

FIG. 4 shows a plurality of memory units linked to a test unit 422 in a "daisy-chain" fashion. That is, a test unit 422 communicates to a first memory unit 450*a*. The first memory unit 450*a* communicates to a second memory unit 450*b*. The second memory unit 450*b* communicates to a next memory unit, etc until a last memory unit 450N is communicated to. The last memory unit 450N communicates to the testing unit 422.

Each memory unit 450*a*, 450*b*, . . . 450N receives commands on a TI input and communicates downstream to the next memory unit (or the test unit 422 in the case of the last memory unit 450N) on a TO output. The TI input and TO output are each coupled to a controller found within each memory unit. That is, the TI input and TO output correspond to the TI input 212 and TO output 213 observed in FIGS. 2*a* and 2*b*.

The Test Enable (TE) input 408 to each memory unit determines whether or not the memory units 450*a*, 504*b*, 450N are in test mode. That is, the TE input to each memory unit seen in FIG. 4 corresponds to the TE input 208 seen in FIGS. 2*a* and 2*b*. When the test unit 422 activates the TE 408 line, each memory unit in the daisy chain is placed in test mode. When the test unit 422 deactivates the TE line 408, the memory units 450*a*, 450*b*, 450N are placed in normal operational mode.

The test unit 422 issues commands to the memory units and receives read data from the memory units. The test unit 422 can issue a command to any memory unit through the daisy chain. After receiving a command, a memory unit will either execute a command (if it is the intended recipient of the command) or pass the command to the next memory unit in the daisy chain (if it is not the intended recipient of the command).

The test unit 422 sends commands to the first memory unit 450*a* in the daisy chain along the Test_in line 412. The command may be intended for the first memory unit 450*a* in the daisy chain or another memory unit in the daisy chain. If the former, the first memory unit 450*a* executes the activity associated with the command; if the latter, the first memory unit 450*a* passes the command downstream in the daisy chain (along line 421) to the second memory unit 450*b* in the daisy chain.

This process is repeated until the intended recipient of the command receives the command from whence it is executed. For a data read command, a memory unit will present output information on its TO line. The output information is passed downstream in the daisy chain from memory unit to memory unit (along a line that couples a sending memory unit's TO output to a receiving memory unit's TI input) until it reaches the test unit 422.

The test unit 422 can therefore send commands and monitor data read from a memory unit. As a result, a wide variety of testing patterns may be applied to a plurality of memories and their performance in response may be monitored. Test unit 422 may be constructed with interface lines that drive the Test_In 412 and Test_Enable 408 lines and receive the Test_Out line 417. The interface lines may be coupled to a processing core (e.g., one or more microprocessors) that executes test routines that control one or more tests that are executed upon the memory units 450*a*, 450*b*, 450N. Specifically, test software may be executed by the test unit 422 that applies specific test patterns to one or more specific memory units and monitors their performance in response.

The test unit 422, therefore, in one embodiment may be implemented as a computer. The comparing of read data against expected value(s) in order to trace a system failure may be executed on the test unit 422.

The test routines may be stored upon a machine readable medium. A machine readable medium includes any mechanism for storing or transmitting information in a form readable by a machine (e.g., a computer). For example, a machine readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

A command, when received by a memory unit, is interpreted by the controller within the memory unit. The controller, recognizing that it is an intended recipient of the command, executes the command by sending/receiving appropriate signals to the memory core (e.g., consistent with the descriptions of the exemplary commands provided above with respect to the command format shown in FIG. 3).

Figure 5:
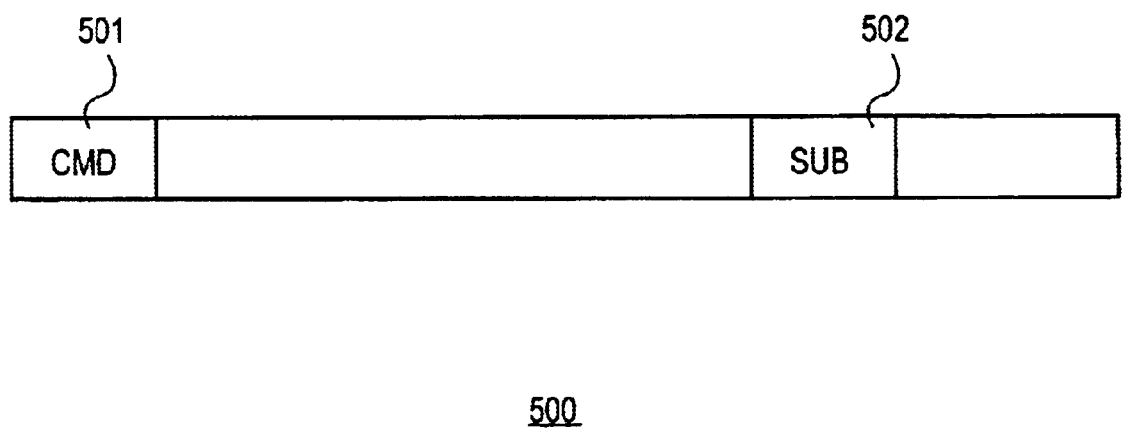
FIG. 5 shows a configuration command format that may be used to communicate configuration commands to the plurality of memory units shown in FIG. 4.

FIG. 3 and its corresponding discussion (provided above) outline just some examples of specific test commands that may be interpreted by the controller and applied to the memory core. FIG. 5 shows an exemplary configuration command format 500 that may be used to configure or otherwise organize the memory testing as between the plurality of memory units 450*a*, 450*b*, . . . 450N. That is, the configuration command format 500 of FIG. 5 is used to prevent confusion amongst the various memories as to which memory is an intended recipient of a test command and which memory is not an intended recipient of a test command.

The configuration command format 500 of FIG. 5 includes a command field 501 and a sub command field 502. The command field 501 of the configuration command format 500 has a unique code unlike those used within the command field 301 of a test command. For example, if a configuration command is given a command field value 501 of "1111" while all other test command fields are not allowed to use a test command field value 301 of "1111", a controller will be able to readily identify whether or not it is being addressed by a test command or a configuration command.

The configuration command also includes a sub command field 502 used to identify specific configuration commands executed by the controller. In an embodiment, a controller may occupy three states: 1)"selected mode"; 2)"transparent mode"; and 3)"waiting for mode". In "selected mode", the controller understands that it is the intended recipient of any test commands it receives. In "transparent mode" the controller understands that it is not the intended recipient of any test commands it receives. In "waiting for mode" the controller is waiting to be told whether it belongs in the "selected mode" or in the "transparent mode".

Figure 6:
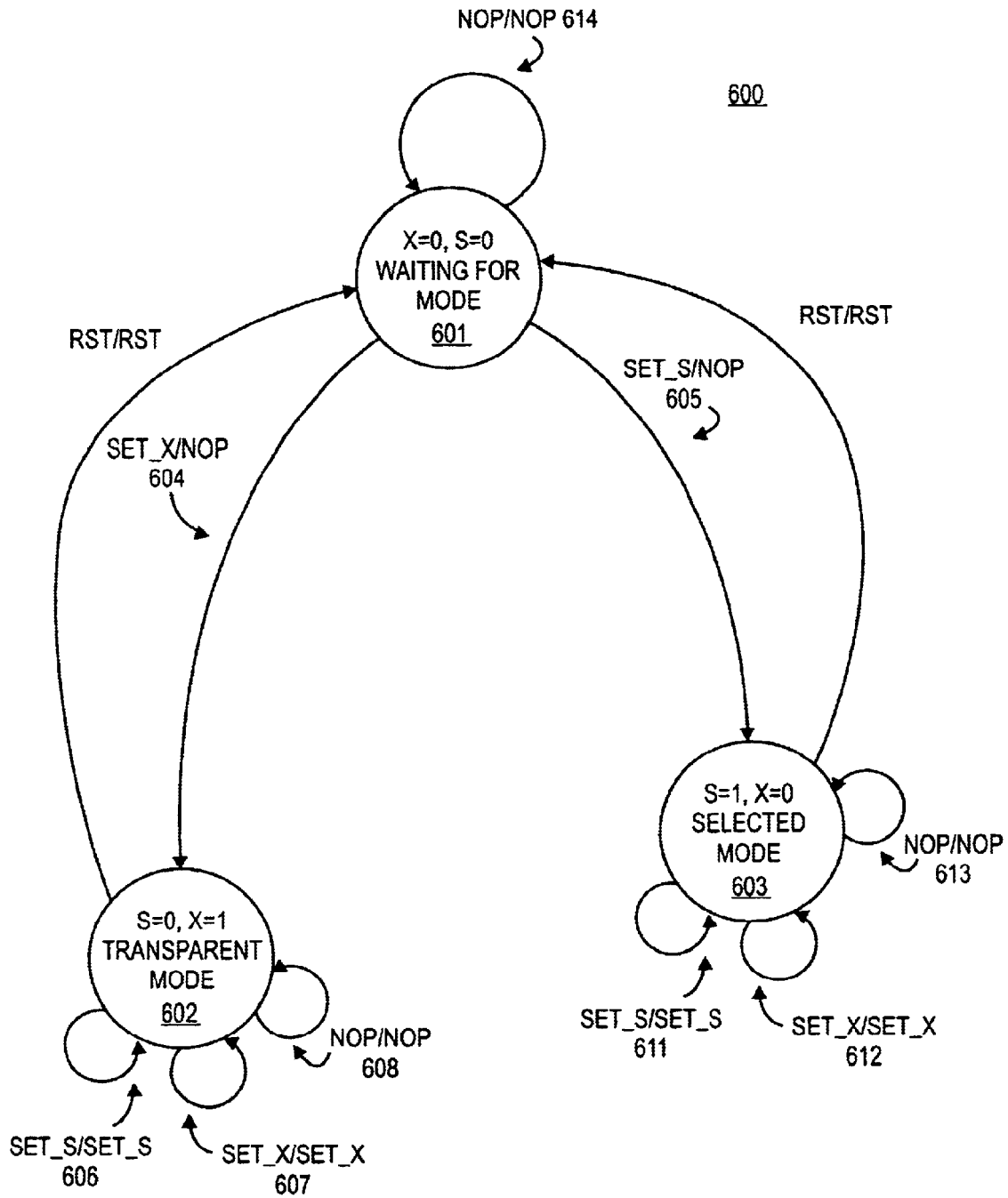
FIG. 6 shows a state machine diagram that may be employed by the controller of FIG. 2.

FIG. 6 shows an exemplary state machine diagram 600 that inter-relates the states described above. In an embodiment, a first bit ("S") represents activation: of the selected mode. That is, S=1 corresponds to activation of the selected mode and S=0 corresponds to inactivation of the selected mode. In an embodiment, a second bit ("X") represents activation of the transparent mode. That is, X=1 corresponds to activation of the transparent mode and X=0 corresponds to inactivation of the transparent mode. S=X=0 corresponds to the "waiting for mode state" because neither the "selected" or "transparent" modes are activated.

In the state diagram 600 of FIG. 6, the notation [input sub command]/[output sub command] is preserved for each sub command (e.g., as specified in the sub command field 502 of a configuration command) received by the controller. Thus, referring to state transition 604 from the waiting for mode state 601 to the transparent state 602 as an example, "SET_X" corresponds to a sub command received by the controller and "NOP" corresponds to a sub command (within a configuration command) that is released from the controller to the next memory unit in the daisy chain in response.

Four configuration sub commands are seen in the state diagram 600 of FIG. 6: SET_S, SET_X, NOP and RST. SET_S corresponds to a sub command that triggers the S bit to transition from 0 to 1. SET_X corresponds to a sub command that triggers the X bit to transition from a 0 to 1. NOP corresponds to a "no operation" in which neither the S bit nor the X bit change state.

The controller initially starts in the waiting for mode state 601. As such, the controller initially starts with both the S bit and the X bit set equal to 0. From this state, the controller can receive any of the three sub commands SET_S, SET_X, and NOP. If the controller receives a NOP command, as seen in transition 614, the controller issues a NOP sub command to the next memory unit in the daisy chain.

If the controller, when in the waiting for mode state 601, receives a SET_X command, the controller transitions 604 to the transparent state 602 and releases a NOP command to the next memory unit in the daisy chain. Similarly if the controller, when in the waiting for mode state 601, receives a SET_S command, the controller transitions 605 to the selected state 603 and releases a NOP command to the next memory unit in the daisy chain.

As seen in the state diagram of FIG. 6, if the controller is in either the transparent state 602 or the selected state, the controller releases as an output sub command (to the next memory unit in the daisy chain) whatever input configuration sub command it received. Furthermore received configuration commands are ignored in either of these states. That is, the receipt 607 of a SET_S sub command when in the transparent state 602 does not cause a transition to the selected state 603. Similarly, the receipt 612 of a SET_X sub command when in the selected state 603 does not cause a transition to the transparent state 602.

The difference between the transparent state 602 and the selected state 603 (as discussed above) is that received test commands are executed by a controller in the selected state 602 while received test commands are ignored by a controller in the transparent state 602. The RST sub command brings the controller back to the waiting for mode state 601 from either the transparent state 602 or the selected state 603.

A fifth sub command (not shown in FIG. 6 for simplicity), SET_ALL, may be used to set all the memory units in the daisy chain to the selected state. That is, receipt of a SET_ALL command triggers a controller to enter the selected state 602 from any state as well as issue a SET_ALL sub command to the next memory unit in the daisy chain.

The state scheme described above may be used to arbitrarily select one or more memory unit for receipt and subsequent execution of one or more test commands. For example, to select the second and fourth memory units in a daisy chain, the following sequence of sub commands may be employed:
RST
SET_X
SET_S
SET_X
SET_S The RST command brings each memory in the daisy chain to the waiting for mode state. The first SET_X sub command triggers the first memory unit in the daisy into the transparent state. The first memory unit in response issues a NOP sub command which has no effect on downstream memory units. Because the first memory unit is in the transparent state, the first SET_S sub command is received, ignored and issued downstream by the first memory unit.

The second memory unit, however, is triggered into the selected state by the first SET_S sub command. The second memory unit, in response issues a NOP sub command downstream which has no effect on subsequent memory units in the daisy chain. The second SET_X sub command is ignored and forwarded by the first and second memory units and then triggers the transition of the third memory unit into the transparent state. The second SET_S sub command is ignored and forwarded by the first, second and third memory units and is then used to trigger the fourth memory unit into the selected state. At this point, the second and fourth memory units will respond to any issued test commands.

Note that a selected test controller may or may not re-issue a copy of the received test command. If the received test command is re-issued downstream, subsequent selected memory units in the daisy chain will execute the test command. If the received test command is not re-issued downstream, only the receiving memory unit will execute the test command. Whether or not a test command should be re-issued may be defined in the test command format.

Referring back to FIG. 4, it is important to point that the various memory units 450a, 450b, . . . 450N may be clocked by different clocking sources when each are in normal operational mode. That is, when in normal operational mode, each of the different memory units may operate at different frequencies with respect to one another.

In test mode, as described above, an upstream memory unit (e.g., memory unit 450a) sends commands to the next downstream memory unit (e.g., memory unit 450b) over a communicative path (e.g., line 421) that couples the sending memory unit's TO output with the receiving memory unit's TI input. If the sending and receiving memory units operate at different clock frequencies, communication between the two may be become unreliable.

As such, in an embodiment, the clock input to each memory unit 450a, 450b, . . . 450N is multiplexed between a first clock signal used during normal operational mode and a second clock signal used during testing mode. As described above, the first clock signal for each memory unit operate at different frequencies with respect to one another. However, the second clock signal for each memory unit is derived from the same clock source. This ensures that each memory unit operates at the same frequency during testing mode (or a multiple thereof).

Given that the testing environment of FIG. 4 may be tailored to feed each of the memory units 450a, 450b, . . . 450N with a clock derived from the same clocking source, FIGS. 7a through 7d and the following discussion address problems that may arise as a result of phase differences between the clocks that drive the different memory units. For example, referring to FIG. 4 and FIG. 7a, CLK A corresponds to a clock that drives the timing of sending memory unit (e.g., memory unit 450a) while CLKB corresponds to a clock that drives the timing of a receiving memory unit (e.g., memory unit 450b).

These clocks are in phase and correspond to an ideal phase relationship as between the two clocks CLKA and CLKB. That is, if the sending memory unit 450a triggers the release of a command from its TO output at a rising clock edge (as occurs at time 701 as seen in FIG. 7a), the receiving memory unit (e.g., memory unit 450b) has a sufficient set-up time and hold time (both equal to the period of the clocks T) to properly latch the command on the next rising clock edge (which occurs at time 702 as seen in FIG. 7a).

However, if there is a phase difference between the two clocks, the set up and hold time margins deteriorate which may cause unreliability in the transfer of information from the sending memory unit 450a to the receiving memory unit 450b. For example, FIG. 7b shows an instance where the receiving memory unit clock CLKB leads the sending memory unit clock CLKA. As a result of this phase difference, the setup time margin has deteriorated because less time exists between the moment the command is sent (at time 701) and the moment the command is received (at time 703).

Setup time margin may be improved by decreasing the clock frequency of the two clocks. That is referring to FIG. 7b, if the frequency of both clocks is decreased, the time between the sending 701 and receiving 703 of a command increases. Thus, in an embodiment, clock signals provided to each memory unit during test mode are limited to a maximum frequency that provides sufficient set up time margins based upon a worst case observed or designed for phase difference between the clocks.

FIG. 7c shows an instance of where the receiving memory unit clock CLKB lags the sending memory unit clock CLKA. If a phase lag occurs (of the receiving clock with respect to the sending clock), hold time margin is threatened because the time between the receiving of the command (at time 704 as seen in FIG. 7c) and the sending of the next command (at time 706 which removes the command from the TI input of the receiving memory unit) decreases. Again, this time may be increased by decreasing the frequencies of the two clocks.

However, note that a sizable phase lag could trigger the receiving of data at time 705 rather than at the proper time 704. In this case, decreasing frequency does not solve the problem. In an embodiment, in order to prevent the improper receiving of a command at an earlier clock edge (such as clock edge 705), the command is designed to be released from the sending memory unit at a later clock edge (such as clock edge 707). Referring to FIG. 7c, note that if the command is released at time 707, the command cannot be received at time 705. As such, the improper reception of a command at time 705 is avoided. The resultant decrease in setup margin that results from releasing the command at a later clock edge 707 may be accounted for by decreasing the frequency of the clocks as described above.

Figure 7D:
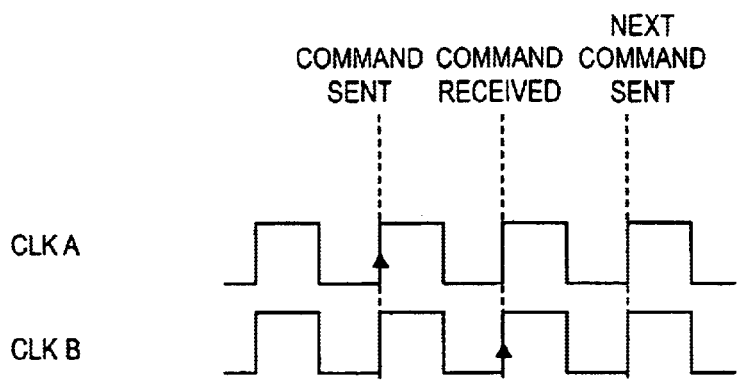
Figure 7D:
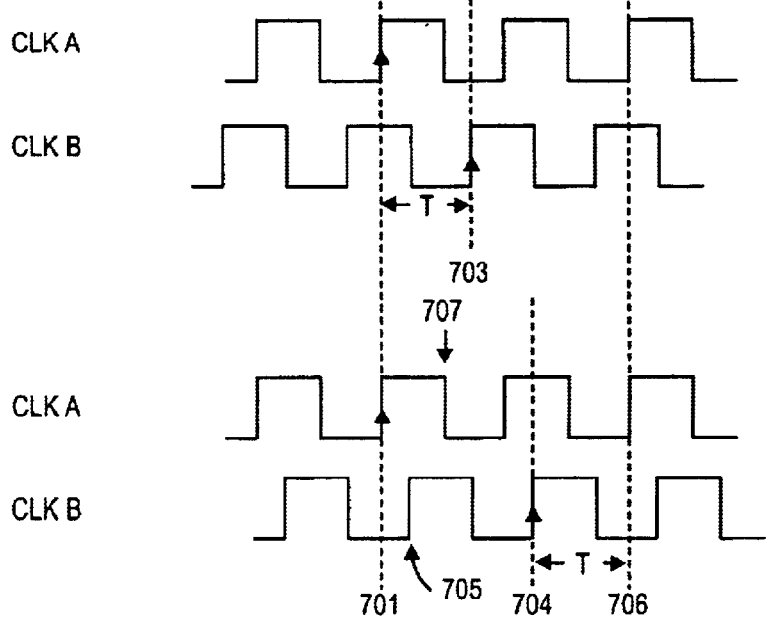
Figure 7D:
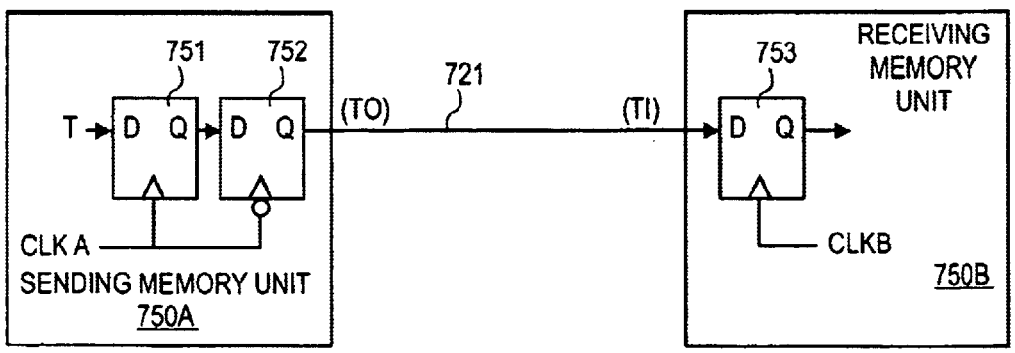

FIG. 7d shows a circuit that may be used to release the command on a later edge. The sending memory unit 750a has a pair of serial DQ flip flops 751, 752. DQ flip flop 751 issues a command on a rising going edge (e.g., at time 701) while DQ flip flop 752 issues a command at the next later falling clock edge (e.g., at time 707). A DQ flip flop 753 within the receiving memory unit 750b receives the command on the next rising edge (e.g., time 704).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A semiconductor chip, comprising:
   a) a multi-ported memory having a plurality of data input ports;
   b) a controller to execute test commands to test said multi-ported memory; and,
   c) an interface circuit to interface said data input ports to both said controller and a system that uses said memory, said interface circuit comprising a group of three circuit paths for each one of said memory input ports, each circuit path of said group of three circuit paths to transport data to be written into said memory, each said group of three circuit paths comprising:
      i) a first circuit path that flows from said system to a data input port that said first circuit path's group of three circuit paths are associated with, said first circuit path to transport data provided by said system;
      ii) a second circuit path that flows from said controller to said data input port, said second circuit path to transport first test data provided by said controller;
      iii) a third circuit path that flows from said controller to register circuitry and from said register circuitry to said data input port, a portion of said third circuit path that precedes said register circuitry to transport second test data provided by said controller, a portion of said third circuit path that follows said register circuitry to transport said second test data after it has already been transported into said memory by another group's second circuit path.

2. The semiconductor chip of claim 1 wherein said interface circuit further comprises a multiplexer comprising:
   a) a channel select input coupled to an output of said controller;
   b) an input through which only one of said circuit paths flow; and,
   c) an output through which more than one of said circuit paths flow.

3. The semiconductor chip of claim 1 wherein said test commands comprise a PRELOAD WRITE command.

4. The semiconductor chip of claim 1 wherein said test commands comprise a PRELOAD READ command.

5. The semiconductor chip of claim 1 wherein said test commands comprise a WRITE command.

6. The semiconductor chip of claim 5 wherein said WRITE command has a field to indicate less than a full word is to be written.

7. The semiconductor chip of claim 1 wherein said test commands comprise a READ command.

8. The semiconductor chip of claim 7 wherein said READ command has a field to indicate less than a full word is to be read.

9. The semiconductor chip of claim 1 wherein said controller comprises an output to send a command to a downstream controller in a daisy chain configuration.

10. The semiconductor chip of claim 9 wherein said controller comprises a transparent mode in which test commands received by said controller are:

not executed by said controller; and forwarded to said downstream controller.

11. The semiconductor chip of claim 10 wherein said controller comprises a selected mode in which test commands received by said controller are executed by said controller.

12. The semiconductor chip of claim 11 wherein said controller, while in said selected mode, also forwards received test commands to said downstream controller.

13. A method, comprising:
(i) while testing a multi-ported memory:
a) issuing test data from a controller to be written into said multi-ported memory:
from at least one data input port of said multi-ported memory, but not,
from all data input ports of said multi-ported memory;
b) writing said test data into said multi-ported memory from said at least one data input port of said multi-ported memory, and, for each of said data input ports of said multi-ported memory that said writing is not applied to:
storing said test data into register circuitry;
c) for at least one of said data input ports of said multi-ported memory that said writing is not applied to:
reading said test data from said register circuitry, and,
writing said test data into said multi-ported memory from said at least one data input port of said data input ports that said writing of b) was not applied to; and,
(ii) while operating a system that uses said multi-ported memory:
writing data into a particular data input port of said multi-ported memory,
said data flowing through a multiplexer through which said test data flowed prior to said test data being said written into said multi-ported memory from said particular data input port.

14. The method of claim 13 wherein said at least one of said data input ports that said writing of b) was not applied to further comprises all of said data input ports that said writing of b) was not applied to.

15. The method of claim 13 further comprising:
sending test commands to said controller;
sending said test commands from said controller to a next controller in a daisy chain configuration;
using said test commands to test a second multi ported memory that said next controller is coupled to.

16. The method of claim 15 wherein said testing of said second multi-ported memory further comprises:
d) issuing second test data from said next controller to be written into said second multi-ported memory:
from at least one data input port of said second multi-ported memory, but not,
from all data input ports of said second multi-ported memory;
e) writing said second test data into said second multi-ported memory from said at least one data input port of said second multi-ported memory, and, for each of said data input ports of said second multi-ported memory that said writing is not applied to:
storing said test data into second register circuitry; and,
f) for at least one of said data input ports of said second multi-ported memory that said writing of e) is not applied to:
reading said second test data from said second register circuitry, and,
writing said second test data into said second multi-ported memory from said at least one data input port of said data input ports that said writing of e) was not applied to.

17. The method of claim 16 further comprising, while operating a system that uses said second multi-ported memory, writing second data into a particular data input port of said second multi-ported memory, said second data flowing through a second multiplexer through which said second test data flowed prior to said second test data being said written into said second multi-ported memory from said particular data input port.

18. The method of claim 16 further comprising sending a command to said controller prior to said sending test commands to said controller that cause said controller to enter a transparent mode and not execute said test commands.

* * * * *